(12) United States Patent
Athanasiadis et al.

(10) Patent No.: US 11,977,181 B2
(45) Date of Patent: May 7, 2024

(54) SYSTEMS AND METHODS FOR PROCESSING ERRORS IN DIGITAL BEAMFORMING RECEIVERS

(71) Applicant: NXP B.V., Eindhoven (NL)

(72) Inventors: Pavlos Athanasiadis, Eindhoven (NL); Konstantinos Doris, Amsterdam (NL); Marios Neofytou, Eindhoven (NL); Georgi Ivanov Radulov, Eindhoven (NL)

(73) Assignee: NXP B.V., Eindhoven (NL)

( * ) Notice: Subject to any disclaimer, the term of this patent is extended or adjusted under 35 U.S.C. 154(b) by 875 days.

(21) Appl. No.: 17/069,675

(22) Filed: Oct. 13, 2020

(65) Prior Publication Data

US 2022/0113373 A1   Apr. 14, 2022

(51) Int. Cl.
*H03M 1/10* (2006.01)
*G01S 7/40* (2006.01)
(Continued)

(52) U.S. Cl.
CPC .............. *G01S 7/4021* (2013.01); *G06F 7/24* (2013.01); *H03M 1/1215* (2013.01); *H03M 1/1245* (2013.01); *G01S 7/027* (2021.05)

(58) Field of Classification Search
CPC ............. H03M 1/1215; H03M 1/0836; H03M 1/0624; H03M 1/121; H03M 1/1245;
(Continued)

(56) References Cited

U.S. PATENT DOCUMENTS

| 8,836,550 B2* | 9/2014 | Snelgrove | H03M 1/1033 341/120 |
| 9,030,341 B2* | 5/2015 | Tan | H03M 1/1052 341/120 |

(Continued)

OTHER PUBLICATIONS

Kurosawa, Naoki, et al., "Explicit Analysis of Channel Mismatch Effects in Time-Interleaved ADC Systems", Circuits and Systems-I: Fundamental Theory and Applications, vol. 48, No. 3, Mar. 2001, 11 pages.

(Continued)

*Primary Examiner* — Linh V Nguyen

(57) ABSTRACT

An apparatus, such as a radar system that conducts beamforming operations, includes a plurality of analog-to-digital-converters (ADCs) and an error correction system coupled to the ADCs. Based upon an assessment of a plurality of errors associated with the ADCs by the error correction system, the error correction system programs sampling operations for the ADCs. The error correction system includes an error correction unit that identifies the plurality of errors associated with a plurality of sub-ADCs of the ADCs, a selection unit coupled to the error correction unit that sorts the errors associated with the plurality of sub-ADCs, and a programming unit coupled to the selection unit that reconfigures the sorted errors to generate a sequence of sampling operations for the plurality of sub-ADCs. Using, for example, a barrel shifter function, the sorted errors are reconfigured by the programming unit such that a summation of elements in each column in a matrix in which the sorted errors are stored are within a predefined value.

17 Claims, 3 Drawing Sheets

(51) Int. Cl.
*G06F 7/24* (2006.01)
*H03M 1/12* (2006.01)
*G01S 7/02* (2006.01)

(58) Field of Classification Search
CPC ............ H03M 1/0626; H03M 1/1033; H03M 1/1009; H03M 1/12; H03M 1/0673; H03M 1/00; H03M 1/1057; H03M 1/124; H03M 1/1023; H03M 1/1061; H03M 1/1225; H03M 1/10; H03M 1/1255; H03M 1/183; H03M 1/36; H03M 1/0607; H03M 1/0614; H03M 1/0634; H03M 1/0675; H03M 1/0818
USPC .................. 341/118–120, 141, 155, 159
See application file for complete search history.

(56) References Cited

U.S. PATENT DOCUMENTS

| | | | | |
|---|---|---|---|---|
| 9,083,366 | B1* | 7/2015 | Annampedu | H04L 7/0331 |
| 9,294,112 | B1* | 3/2016 | Devarajan | H03M 1/0836 |
| 9,485,039 | B1* | 11/2016 | Malkin | H04B 17/14 |
| 9,602,116 | B1* | 3/2017 | Le | H03M 1/1038 |
| 9,685,970 | B1* | 6/2017 | Lee | H03M 1/1245 |
| 9,780,802 | B1* | 10/2017 | Kim | H03M 1/0626 |
| 9,793,910 | B1* | 10/2017 | Devarajan | H03M 1/124 |
| 2006/0061501 | A1* | 3/2006 | Sheng | H04N 21/4263 341/155 |
| 2006/0097901 | A1 | 5/2006 | Draxelmayr et al. | |
| 2012/0147943 | A1* | 6/2012 | Goodman | H04L 27/01 375/232 |
| 2021/0135678 | A1 | 5/2021 | Pu et al. | |

OTHER PUBLICATIONS

Schmidt, Christian A., et al., "Efficient Estimation and Correction of Mismatch Errors in Time-Interleaved ADCs", Instrumentation and Measurement, vol. 65, No. 2, Feb. 2016, 12 pages.

Wang, Jun-Shan, et al., "An Optimization Algorithm for Timing-Error Estimation in Time-Interleaved ADCs", 11th International Conference on Solid-State and Integrated Circuit Technology, Oct. 2012, 3 pages.

Le Duc, Han, et al,. "Estimation Techniques for Timing Mismatch in Time-Interleaved Analog-To-Digital Converters: Limitations and Solutions", International Conference on Electronics, Circuits and Systems (ICECS), Dec. 2016, 4 pages.

Singh, Simran, et al., "Digitally Enhanced Wideband I/Q Downconversion Receiver With 2-Channel Time-Interleaved ADCs", Circuits and Systems II: Express Briefs, vol. 63, Issue 1, Jan. 2016, 5 pages.

Le Dortz, Nicolas, et al., "A 1.62GS/s Time-Interleaved SAR ADC With Digital Background Mismatch Calibration Achieving Interleaving Spurs Below 70dBFS", International Solid-State Circuits Conference Digest of Technical Papers (ISSCC), Feb. 2014, 3 pages.

Qiu, Lei, et al., "A 16-mW 1-GS/s With 49.6-dB SNDR TI-SAR ADC for Software-Defined Radio in 65-nm CMOS", Very Large Scale Integration (VLSI) Systems, vol. 26, Issue 3, Mar. 2018, 12 pages.

Harpe, Pieter, et al., "Analog Calibration of Channel Mismatches in Time-Interleaved ADCs", 18th European Conference on Circuit Theory and Design, Aug. 2007, 4 pages.

Janssen, Erwin, et al., "An 11b 3.6GS/s Time-Interleaved SAR ADC in 65nm CMOS", International Solid-State Circuits Conference Digest of Technical Papers (ISSCC), Feb. 2013, 3 pages.

Tang, Yongjian, et al., "A 14 bit 200 MS/s DAC With SFDR >78 dBc, IM3 < -83 dBc and NSD <-163 dBm/Hz Across the Whole Nyquist Band Enabled by Dynamic-Mismatch Mapping", Symposium on VLSI Circuits, Jun. 2010, 2 pages.

Van De Vel, Hans, et al., "A 240mW 16b 3.2GS/s DAC in 65nm CMOS with <-80dBc IM3 up to 600MHz", International Solid-State Circuits Conference (ISSCC), Feb. 2014, 3 pages.

Doris, Kostas, et al., "A 480 mW 2.6 GS/s 10b Time-Interleaved ADC With 48.5 dB SNDR up to Nyquist in 65 nm CMOS", Solid-State Circuits, vol. 46, No. 12, Dec. 2011, 13 pages.

Soudan, M., "Methodology for Mismatch Reduction in Time-Interleaved ADCs", IEEE 18th European Conference on Circuit Theory and Design, Aug. 27, 2007.

Soudan, M., et al., "Methodology for Minimizing Timing Mismatch in Time-Interleaved ADCs", retrieved from the internet: https://mural.maynoothuniversity.ie/742/1/imek007_MS_final (accepted).pdf, pp. 1-6, retrieved Mar. 1, 2022.

Vogel, C., "Spectral Shaping of Timing Mismatches in Time-Interleaved Analog-to-Digital Converters", IEEE International Symposium on Circuits and Systems (ISCAS), May 23-26, 2005.

* cited by examiner

SYSTEMS AND METHODS FOR PROCESSING ERRORS IN DIGITAL BEAMFORMING RECEIVERS

BACKGROUND

Digital beamforming receivers utilize a large array of analog-to-converters (ADCs) to process broadband signals ranging from hundreds of megahertz (MHz) to multiple gigahertz (GHz) with moderate to high resolution, e.g., 8-12 bits. The ADCs should operate synchronously with minimal timing errors in order to produce reliable digital output. Due to the large bandwidth requirements and high dynamic range required for digital beamforming receivers, time-interleaved ADC architectures are often used for analog-to-digital conversion. A time-interleaved ADC is an ADC that uses multiple sub-ADCs that sample at different time instances. Utilization of time-interleaved ADCs results in a sampling rate increase proportional to the number of sub-ADCs used. Due to the increased number of sub-ADCs utilized for digital beamforming, additional mismatch error occurs between the sub-ADCs. The result is that the signal at the ADC is corrupted by signal errors resulting in unwanted output at the output of the digital beamforming receiver system.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
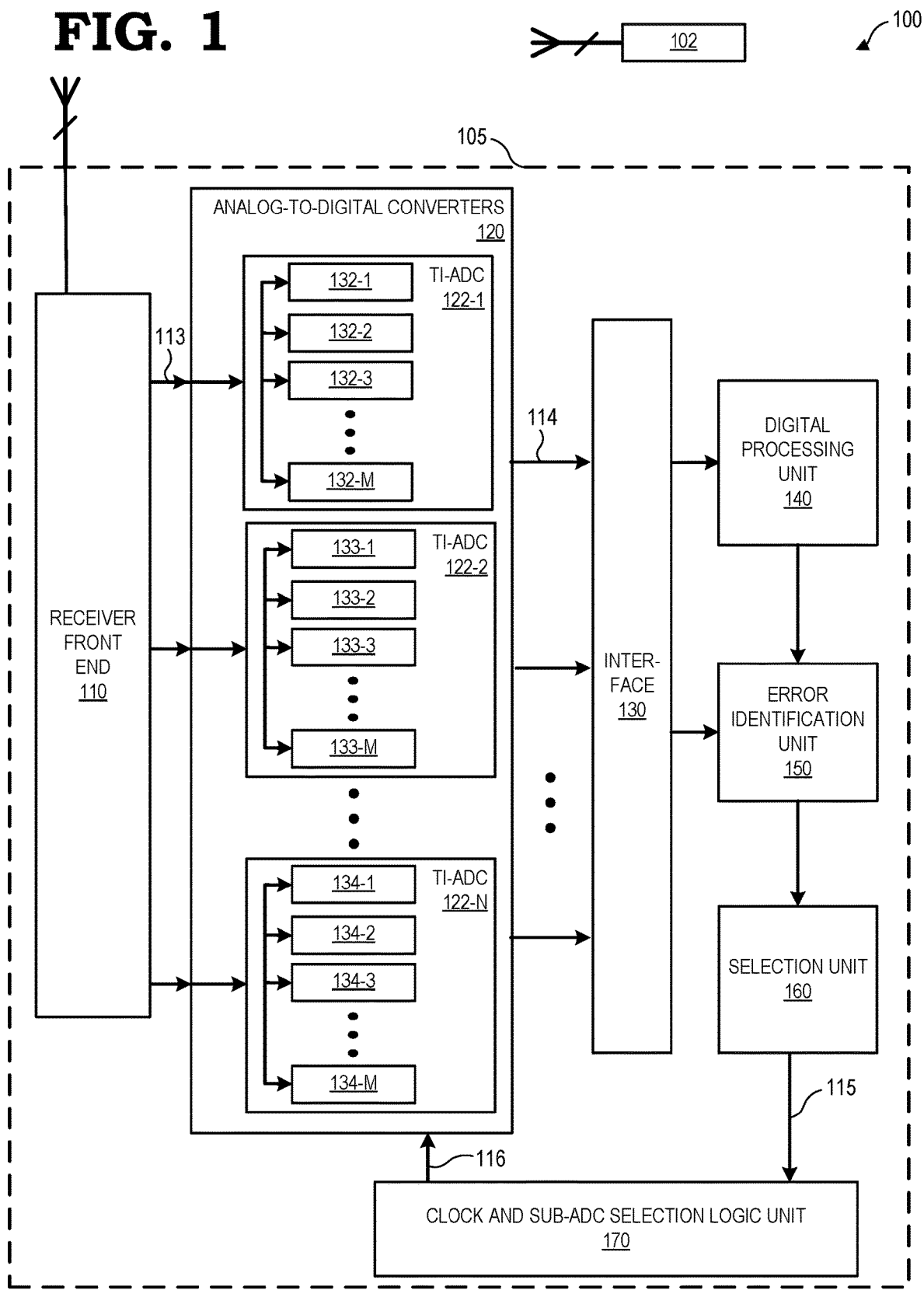
FIG. 1 is a block diagram of a wireless system having a digital beamforming receiver in accordance with some embodiments.
Figure 2:
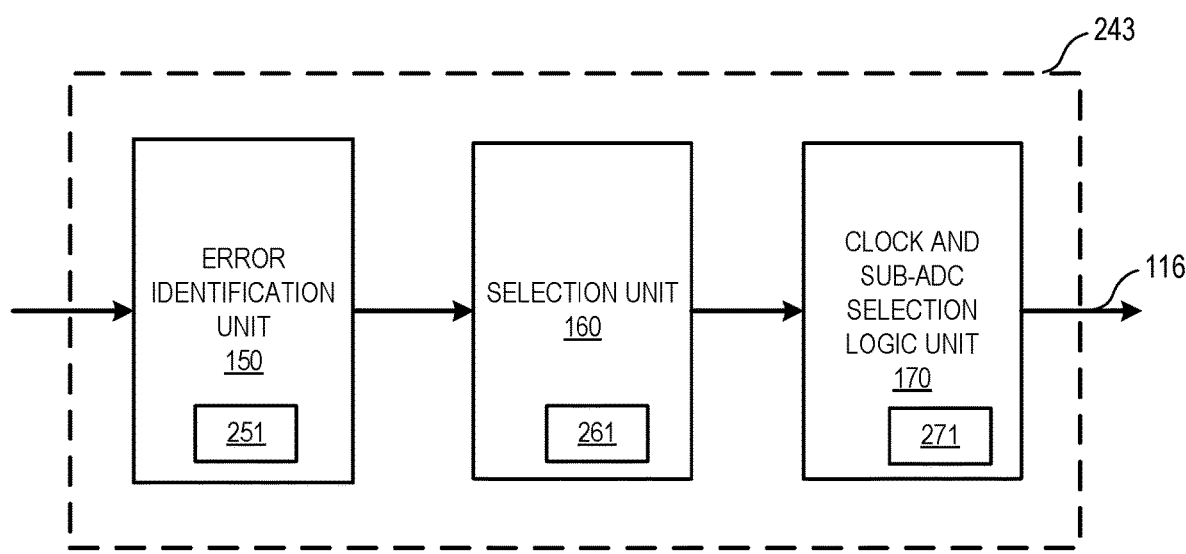
FIG. 2 is a block diagram of an error correction system of the digital beamforming receiver system of FIG. 1.
Figure 3:
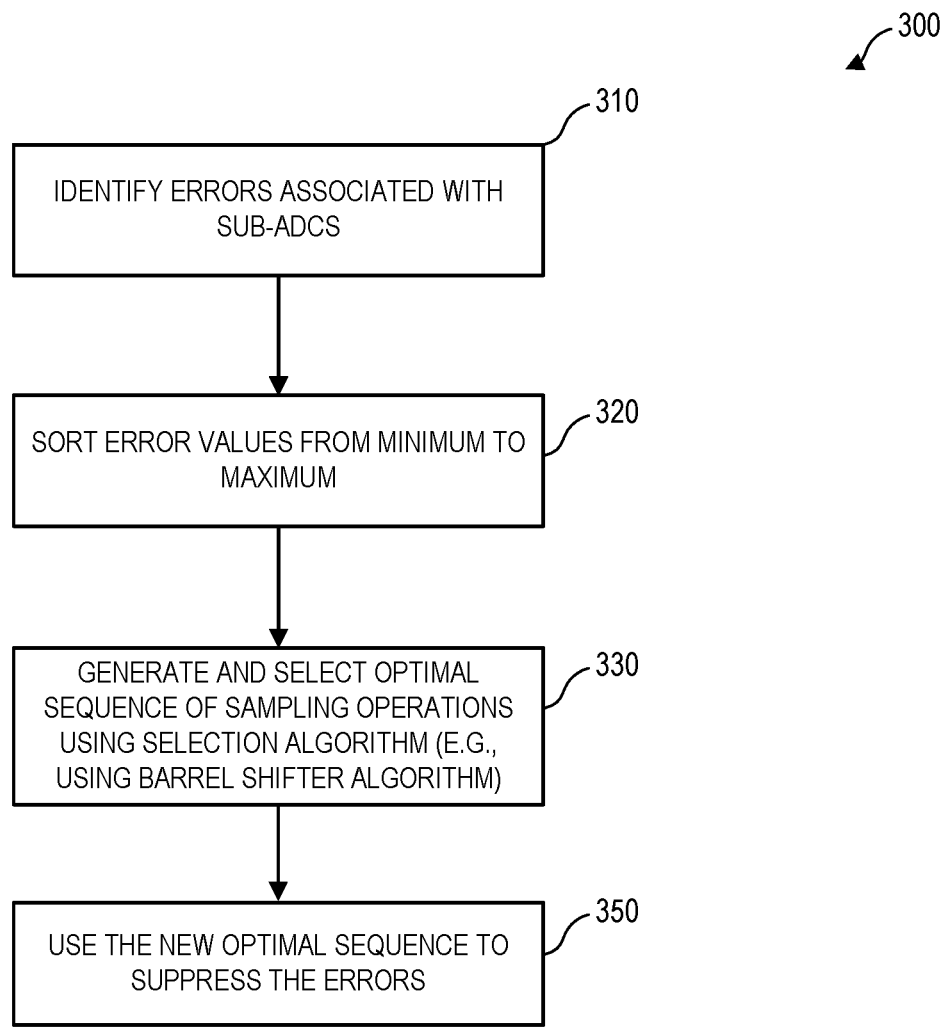
FIG. 3 is a flow diagram of a method of error correction in digital beamforming system of FIG. 1 in accordance with at least one embodiment.

FIGS. 1-3 illustrate a wireless system having a digital beamforming receiver in accordance with some embodiments. In some embodiments, an error correction system in the digital beamforming receiver is configured to reduce the amount of error that occurs in the digital beamforming receiver when signals are sampled by analog-to-digital converters (ADCs). The ADCs may be, for example, time-interleaving ADCs that are designed to utilize sub-ADCs to perform sampling operations in tandem. In order to reduce the amount of error in the digital beamforming system, an error correction system dynamically adjusts the sequence of sampling operations such that the sequence of sampling operations corresponds to a reduction in the number of errors in the ADCs. The error correction system receives sampled signals from sub-ADCs of the ADCs, detects the errors associated with each sub-ADC, and uses the detected errors to generate an error matrix that is reconfigured such that a summation of the errors in each column approximates to the summation of errors of other columns of the reconfigured matrix. The error correction system uses the reconfigured error matrix to generate a sequence of sample operations for the sub-ADCs that correspond to the minimized errors associated with the reconfigured matrix. The newly created sequence of sample operations are used to sequence the sub-ADCs of the time-interleaving ADCs. Sampling according to the newly generated sequence of sampling operations allows the digital beamforming system to reduce the amount of errors generated when sampling additional signals received by the digital beamforming system.

FIG. 1 illustrates a wireless system 100 in accordance with some embodiments. In some embodiments, the wireless system may be, for example, a Radio Detection And Ranging (RADAR) system. In some embodiments, the wireless system 100 includes a transmitter 102 and a digital beamforming receiver 105 according to some embodiments. Digital beamforming receiver 105 includes a receiver front-end 110, analog-to-digital-converters (ADCs) 120, an interface 130, a digital processing unit 140, an error identification unit 150, a selection unit 160, a clock and sub-ADC selection logic unit 170. In some embodiments, digital processing unit 140 is configured to perform beamforming operations or functions. ADC 120 includes time-interleaved analog-to-digital converters (TI-ADC) 122-1-122-N. TI-ADC 122-1 includes sub-ADCs 132-1-132-M. TI-ADC 122-2 includes sub-ADCs 133-1-133-M. TI-ADC 122-N includes sub-ADCs 134-1-134-M. In some embodiments, receiver front-end 110 is coupled to ADCs 120. ADCs 120 are coupled to an interface 130 and clock and sub-ADC selection logic unit 170. Interface 130 is coupled to error identification unit 150. Error identification unit 150 is coupled to selection unit 160. Selection unit 160 is coupled to clock and sub-ADC selection logic unit 170. In some embodiments, the interface 130 is, for example, a memory or registers that store the data incoming from ADCs 120. In some embodiments, the number of antenna inputs to the receiver front-end 110 is equal to the number N of ADC inputs or fewer than N for the case of a hybrid/analog digital beamforming system.

In operation, receiver front-end 110 of digital beamforming receiver 105 receives transmission signals (radio frequency (RF) signals or millimeter wave signals) originating from a transmitter (not shown) and converts the signals to intermediate frequency (IF) signals. In order to convert the IF signals to digital signals, receiver front-end 110 provides the IF signals to each sub-ADC 132, sub-ADC 133 and sub-ADC 134 of TI-ADC 122 for sampling. In some embodiments, the number of sub-ADCs and TI-ADCs that are used to sample the IF signals may vary depending on, for example, the number of sub-ADCs and TI-ADCs required to perform sampling operations.

TI-ADC 122 receives the input IF signals and commences the process of using the sub-ADCs of the time-interleaving ADCs to sample and convert the IF signals to digital form. For the example embodiment depicted in FIG. 1, the input IF signal received by TI-ADC 122-1 is sampled by each sub-ADC 132-1-132-M. The input IF signal received by TI-ADC 122-2 is sampled by each sub-ADC 133-1-133-M. The input IF signal received by TI-ADC 122-N is sampled by each sub-ADC 134-1-134-M. In some embodiments, as is the case in typical time interleaving sampling operations, the first sub-ADC 132-1 of TI-ADC 122-1, the first sub-ADC 133-1 of TI-ADC 122-2, and the first sub-ADC 134-1 are configured to simultaneously sample the input IF signal. The second sub-ADC 132-2 of TI-ADC 122-1, the second sub-ADC 133-2 of TI-ADC 122-2, and the second sub-ADC 134-2 are configured to simultaneously sample the input IF signal. The third sub-ADC 132-3 of TI-ADC 122-1, the third sub-ADC 133-3 of TI-ADC 122-2, and the third sub-ADC 134-3 are configured to simultaneously sample the input IF signal. However, due to, for example, design errors in the manufacturing of the sub-ADCs and TI-ADCS, there are typically errors, such as, for example, timing errors or offset errors, associated with the sub-ADCs that are configured to sample the IF signals simultaneously. In order to identify the errors, the TI-ADCs 122 of ADC 120 provide the sampled output from the sub-ADCs 132, sub-ADCs 133, and sub-ADCs 134 to error identification unit 150.

In some embodiments, the error identification unit 150 receives the sampled output signals from digital processing unit 140 or from each sub-ADC 132, sub-ADC 133, and sub-ADC 134 of TI-ADCs 122 and identifies errors in the received sampled signals. Typical correlation and averaging processing techniques known in the art are used to identify the errors. In some embodiments the errors identified are associated with each sub-ADC (e.g., timing, offset, and gain) and/or with digital processing unit 140 (e.g. spectral images, ghost errors, or spurs). That is, in some embodiments, digital processing unit 140 generates digitally beamformed data from sampled output 114, but the digitally beamformed data includes, for example, sub-ADC errors. In some embodiments, digital processing unit 140 delivers its output to error identification unit 150 for purposes of identifying spectral images instead of or in addition to individual sub-ADC errors. During the error identification process, error identification unit 150 generates an error matrix or table, T, that includes the identified errors (e.g., timing errors, offset errors, spectral images, ghost errors, or spurs etc.) of the sub-ADCs sub-ADC 132, sub-ADC 133, and sub-ADC 134 in the TI-ADCs 122. In some embodiments, each row in the table T represents the errors of the sub-ADCs for a single TI-ADC 122. For example, T11, which is the first column in the first row of the table, is the timing error of the first sub-ADC 132-1 of the first time interleave ADC, i.e., TI-ADC 122-1. T12 is the timing error of the second sub-ADC 132-2 of TI-ADC 122-1, etc. Similarly, T21 is the timing error of the first sub-ADC 133-1 of the second time interleave ADC, i.e., TI-ADC 122-2. T22 is the timing error of the second sub-ADC 133-2 of TI-ADC 122-2, etc. After generating the table T, the table T generated by error identification unit 150 is provided to selection unit 160.

In some embodiments, selection unit 160 receives the error matrix T from error identification unit 150 and sorts the error matrix T from minimum-to-maximum to generate a matrix S. That is, after the timing errors have been stored in matrix T, selection unit 160 uses a sort function to process the errors into a sorted matrix S. In some embodiments, the sorting function that is used in the error correction process is a minimum-error-to-maximum error sorting function. After generating the sorted matrix S, selection unit 160 provides the sorted matrix S to clock and sub-ADC selection unit 170.

In some embodiments, clock and sub-ADC selection unit 170 receives the sorted matrix S and uses a cost function to position the elements within the same row of matrix S into a matrix C in such that when the values of each column in matrix C are summed, the sum of each column of matrix C is within a predefined target value. In some embodiments, the predefined target value is defined such that the sum of each column in is approximately identical. In some embodiments, the cost function positions the elements within the same row of matrix C in such an order such that when the values of each column are summed, the sum of each column are exactly identical. Thus, using matrix C, clock and sub-ADC selection unit 170 is able to pair the sub-ADCs that have minimum errors with the sub-ADCs that have maximum errors such that the summation of the errors in each column approximate to each other. Clock and sub-ADC selection unit 170 uses the pairing to sequence the sampling operations of the sub-ADCs that have been mapped to the error elements in reconfigured matrix C.

In some embodiments, clock and sub-ADC selection logic unit 170 uses a barrel-shifter function to pair the sub-ADCs with minimum errors with sub-ADCs that have maximum errors. In some embodiments, when clock and sub-ADC selection unit 170 barrel-shifts to the last row as many columns as there are in matrix S, the maximum error sub-ADC is paired with the minimum error sub-ADC of the time interleave ADC. In some embodiments, the TI-ADCs of ADC 120 are programmed by clock and sub-ADC selection logic unit 170 such that the maximum error sub-ADC samples at the same time as the minimum error sub-ADC of time interleave ADC. The paired sequence of operations is provided by clock and sub-ADC selection logic unit 170 to TI-ADCs 122 as programming for the sub-ADCs, which then sample according to the updated pair sequence of operations.

FIG. 2 depicts an error correction system 243 of digital beamforming receiver 105 of FIG. 1 in accordance with some embodiments. The error correction system 243 includes error identification unit 150, selection unit 160, and clock and sub-ADC selection logic unit 170. As stated previously, error identification unit 150 receives the sampled output 114 from sub-ADCs 132, sub-ADCs 133, and sub-ADCs 134 of TI-ADCs 122 and identifies the errors in the processed output in order to generate the error matrix 251 (T), sorted matrix 261 (S), and cost matrix 271 (C).

In some embodiments, the matrices T, S, and C are used to optimize the sequence of sampling operations of the sub-ADCs 132-1. As stated previously, the matrix T is a matrix that represents errors caused by the sub-ADCs 132. In some embodiments, the elements in matrix T represent a timing error that is a difference in the ideal sampling time and the actual sampling time of sub-ADCs 132. The matrix S is a matrix that is used to sort the errors captured in matrix T from minimum to maximum. Matrix C is a matrix that is used to rearrange the error values in S using, for example, a barrel shifter function, such that the summation of each column C approximates in value to the summation of other columns in C. Example matrices T, S, and C and corresponding are depicted below:

$$T = \begin{bmatrix} t_{1,1} & t_{1,2} & \cdots & t_{1,M} \\ t_{2,1} & t_{2,2} & \cdots & t_{2,M} \\ \vdots & \vdots & \cdots & \vdots \\ t_{N,1} & t_{N,2} & \cdots & t_{N,M} \end{bmatrix}$$

$$T_{sum} = \begin{bmatrix} \sum_{i=1}^{N} t_{i,1} & \sum_{i=1}^{N} t_{i,2} & \cdots & \sum_{i=1}^{N} t_{i,M} \end{bmatrix}$$

-continued $$S = \begin{bmatrix} s_{1,1} & s_{1,2} & \cdots & s_{1,M} \\ s_{2,1} & s_{2,2} & \cdots & s_{2,M} \\ \vdots & \vdots & \cdots & \vdots \\ s_{N,1} & s_{N,2} & \cdots & s_{N,M} \end{bmatrix}$$

$$S_{sum} = \begin{bmatrix} \sum_{i=1}^{N} s_{i,1} & \sum_{i=1}^{N} s_{i,2} & \cdots & \sum_{i=1}^{N} s_{i,M} \end{bmatrix}$$

where $S_{i,1} = \min(t_{i,j})$ and $S_{i,M} = \max(t_{i,j})$ $$C = \begin{bmatrix} s_{1,1} & s_{1,2} & \cdots & s_{1,M} \\ s_{2,M} & s_{2,1} & \cdots & s_{2,M-1} \\ \vdots & \vdots & \cdots & \vdots \\ s_{N,2} & s_{N,3} & \cdots & s_{N,1} \end{bmatrix}$$

$$C_{sum} = \begin{bmatrix} \sum_{i=1}^{N} c_{i,1} & \sum_{i=1}^{N} c_{i,2} & \cdots & \sum_{i=1}^{N} c_{i,M} \end{bmatrix}$$

where $c_{i,j}$ refers to the element of C matrix position row→i and column→j.

In some embodiments, during operation of ADCs 120, the TI-ADCs 122 sample every Ts/M sequentially with the sub-ADCs 132 in each column. For example, in one embodiment, error identification unit 150 determines that the third sub-ADC 132-3 of the first TI-ADC 122-1 has a timing error $t_{1,3}$ seconds compared to an ideal moment or sampling instance. In some embodiments, the ideal sampling instances for each sub-ADC are stored in, for example, the error identification unit 150. For sampling moments n, n+1, n+2, ... the sub-ADCs in column 1, 2 ... are used respectively. Once the sub-ADCs 132-1 of the last column M is reached, representing the last interleaved sub-ADC of each TI-ADC, the operation commences again from the first column.

After error identification unit 150 stores all the errors in error matrix 251, selection unit 160 uses a sort function to process the errors into sorted matrix 261. The sorted matrix 261 is provided to clock and sub-ADC selection logic unit 170. Clock and sub-ADC selection logic unit 170 uses a cost function to position the elements of sorted matrix 261 into cost matrix 271 such that when the values of each column of cost matrix 271 are summed, the sum of each column in cost matrix 271 is approximately identical. In some embodiments, a deterministic algorithm (e.g. sort, inverter sequence and barrel-shifter) or a stochastic algorithm (e.g., simulated annealing, neural networks (machine learning)) that is trained to optimize the performance when the given performance cost function is known. Clock and sub-ADC selection logic unit 170 uses the paired sub-ADCs that yielded the cost matrix 271 to generate the sequence of operations. Clock and sub-ADC selection logic unit 170 receives the optimal sequence of sub-ADC operations from selection unit 160 and programs the sequence of sub-ADCs 132 using a clock and sub-ADC selection logic unit 170.

In some embodiments, for example, assuming randomly distributed timing errors with σ=1 picoseconds across T (for example, due to transistor threshold mismatch in the samplers of each sub-ADC) and with deterministic errors (same errors for each row in matrix T, due to, for example, clock skew in the large clock distribution network of the ADC array), a sinusoidal input signal is used as input signal. Error identification unit 150 receives ADC channel output 22 and measures the magnitude of the mismatch errors (e.g. timing errors, offset errors, gain error, bandwidth error, etc.). The magnitude of each error is placed in matrix T. Error identification unit 150 provides the measured errors in matrix form to selection unit 160.

Selection unit 160 receives the mismatch errors in the T matrix from error identification unit 150 and, in some embodiments, determines the optimal sequence of sub-ADC operations across the N×M array for each sampling moment using a selection algorithm. In some embodiments, selection unit 160 provides the optimal sequence of sub-ADC operations to a clock and sub-ADC selection logic unit 170.

For the example provided above, in some embodiments, a barrel shifter function is adopted as a selection method. Matrix C depicts the re-arrangement of the error values based on the barrel shifter function. The sorted error values of the first row that refer to the first ADC of the receiver array remain unchanged. Thus, the first ADC captures the first sample using the sub-ADC with the lowest error. Then the second sample is captured by the sub-ADC with the second lowest error, while the sub-ADC with the largest error is used last in sequence. Considering the second ADC in the array the barrel shifter will shift the error values by one position as seen in the second row of C. Thus, for the last ADC the sub-ADC introducing the largest error will be used for capturing the first sample and the sub-ADC with the lowest error for the last sample. For the third and the fourth ADCs barrel shifter applies two and three positions shift respectively. This action is performed for all the ADC error sets, applying the appropriate shift and resulting in the optimal sequence of sub-ADC sampling operations for the sub-ADCs.

In some embodiments, the position of the error values in C implies the new clocking sequence for each ADC in the array. After the sampling process, the beamforming operation imports the total error in each sample (that is, across each column) in the array $C_{sum}$, due to the summation in beamforming function of all samples from all array elements. The above means that for a case of randomly distributed errors, each of the elements in the $C_{sum}$ will approximate the mean value of the distribution. The more time interleaving sub-ADCs per ADC and the larger the beamforming array is the more accurate the approximation of the mean error will be. In the case of deterministic timing error, where each of the ADCs in the array introduces the same set of errors as for example design artefacts from clock signal interconnecting networks, the application of the algorithm will result in total error cancelation, meaning that the $C_{sum}$ elements will be equal to zero or another constant value that will be a fixed delay for all elements.

FIG. 3 is a flow diagram of a method 300 of correcting errors in the radar system of FIG. 1 in accordance with at least one embodiment. At block 310, a plurality of errors associated with sub-ADCs 132-134 are identified by an error identification unit 150 and stored in a matrix T. In some embodiments the error identification unit 150 identifies or measures a true indication of signal error at the digital beamforming output (e.g., not the timing or offset error but the resulting ghost, image, or spur signal created by it on the input signal when sampled) and subsequently steers the programming of sampling operations to a target sampling sequence that minimizes the true indication of signal error. In some embodiments, error correction unit 150 forms a error vector with vector dimensions consisting of one or more of a plurality of errors (e.g., a timing error, an offset error, a gain error, a ghost error, and a bandwidth error) and the programming of sampling operations or correction algorithm minimizes the magnitude or phase of the vector errors. At block 320, the selection unit 160 sorts the error values of matrix T from minimum-error-to-maximum-error using a sorting function. At block 330, an optimal sequence of sample operations or pairing of sub-ADCs is selected using, for example, a barrel shifter function or algorithm. In some embodiments, although each error type detected by error identification unit 150 may have an optimal sequence that suppresses that type of error, a new sequence of sample operations derived from the already captured sequences of operations may provide suppression to all the types of errors detected by the error identification unit 150 simultaneously. At block 350, the new sequence of sampling operations is used to suppress the errors caused by the sub-ADCs 132-134 of the TI-ADCs 122.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An apparatus, comprising:
a plurality of analog-to-digital-converters (ADCs); and
an error correction system coupled to the ADCs, the error correction system including:
an error correction unit that identifies the plurality of errors associated with a plurality of sub-ADCs of the ADCs;
a selection unit coupled to the error correction unit that sorts the errors associated with the plurality of sub-ADCs; and
a programming unit coupled to the selection unit that reconfigures the sorted errors to generate a sequence of sampling operations for the plurality of sub-ADCs;
wherein the error correction system is configured to program sampling operations of the ADCs based upon an assessment of a plurality of errors associated with the ADCs by the error correction system.

2. The apparatus of claim 1, wherein:
the sorted errors are reconfigured by the programming unit such that a summation of elements in each column in a matrix in which the sorted errors are stored are within a predefined target value.

3. The apparatus of claim 1, wherein:
the sequence of sampling operations dictates an order of which the plurality of sub-ADCs sample a received signal.

4. The apparatus of claim 1, wherein:
a plurality of sub-ADCs of the ADCs are programmed according to a pairing of the sub-ADCs.

5. The apparatus of claim 4, wherein:
the pairing corresponds to sorted errors whose summation of elements are approximately equal.

6. The apparatus of claim 1, wherein:
the plurality of ADCs are time-interleaved analog-to-digital converters.

7. The apparatus of claim 1, wherein:
the plurality of errors originate from at least one of the plurality of ADCs and a digital processing unit, the plurality of errors being one of a timing error, an offset error, a gain error, a bandwidth error, a spur error, and an image error.

8. The apparatus of claim 1, wherein:
a receiver in the apparatus performs beamforming operations.

9. A method, comprising:
assessing a plurality of errors associated with a plurality of analog-to-digital converters (ADCs); and
programming sampling operations of the plurality of ADCs based on the assessment of the plurality of errors, wherein the assessing the plurality of errors includes: identifying a plurality of errors associated with a plurality of sub-ADCs of the plurality of ADCs; sorting the errors associated with the plurality of sub-ADCs; and reconfiguring the sorted errors such that a summation of elements in each column are of a matrix in which the sorted errors are stored within a predefined target value.

10. The method of claim 9, wherein:
the sorted errors are reconfigured such that the summation of elements in each column of a matrix in which the sorted errors are stored are approximately equal.

11. The method of claim 9, wherein the plurality of errors are sorted from minimum error to maximum error.

12. The method of claim 9, wherein the sorted errors are reconfigured using a cost function.

13. The method of claim 9, wherein an optimum sampling sequence of operations is selected using a selection algorithm.

14. The method of claim 13, wherein the selection algorithm is a barrel-shifter algorithm.

15. The method of claim 10, wherein:
the plurality of sub-ADCs are programmed according to a pairing of the sub-ADCs.

16. A method, comprising:
sampling, using a plurality of sub-ADCs, a first plurality of signals according to a first sequence of sampling operations;
identifying a plurality of errors associated with the first plurality of sampled signals sampled using the plurality of sub-ADCs; and
based on an error assessment of the first plurality of sampled signals, sampling a second plurality of signals according to an updated sequence of sampling operations, the error assessment comprising:
sorting the plurality of errors associated with the first plurality of sampled signals; and
reconfiguring the sorted errors such that a summation of elements in each column are within a predefined target value.

17. The method of claim 16:
wherein the updated sequence of sampling operations results in a first error associated with a first sub-ADC of the plurality of sub-ADCs being nullified by a second error associated with a second sub-ADC of the plurality of sub-ADCs.

* * * * *